US011700008B2

(12) United States Patent
Schaefer et al.

(10) Patent No.: US 11,700,008 B2
(45) Date of Patent: Jul. 11, 2023

(54) PHASE-SHIFTED SAMPLING MODULE AND METHOD FOR DETERMINING FILTER COEFFICIENTS (71) Applicant: Rohde & Schwarz GmbH & Co. KG, Munich (DE)

(72) Inventors: Andrew Schaefer, Munich (DE); Cornelius Kaiser, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 196 days.

(21) Appl. No.: 17/156,189

(22) Filed: Jan. 22, 2021

(65) Prior Publication Data

US 2022/0239306 A1 Jul. 28, 2022

(51) Int. Cl.
*H03M 1/12* (2006.01)
*H03K 5/00* (2006.01)

(52) U.S. Cl.
CPC ............ *H03M 1/1245* (2013.01); *H03K 5/00* (2013.01); *H03K 2005/00286* (2013.01)

(58) Field of Classification Search
CPC ..... H03M 1/1245; H03M 1/0614; H03K 5/00
USPC ......................................... 341/155, 118, 120
See application file for complete search history.

(56) References Cited

U.S. PATENT DOCUMENTS

| 5,239,299 | A | 8/1993 | Apple et al. |
| 7,394,415 | B2 | 7/2008 | Fuse et al. |
| 8,009,070 | B2 | 8/2011 | Johansson et al. |
| 8,698,659 | B2 | 4/2014 | Hovakimyan et al. |
| 9,143,147 | B1 | 9/2015 | Ray et al. |
| 9,929,793 | B2* | 3/2018 | Kummetz .......... H04B 7/15585 |
| 2007/0171116 | A1 | 7/2007 | Fuse et al. |
| 2007/0262895 | A1 | 11/2007 | Stein et al. |
| 2008/0169949 | A1 | 7/2008 | Xu |
| 2014/0112424 | A1* | 4/2014 | Spinnler ............... H04L 7/0029 375/354 |
| 2018/0247522 | A1* | 8/2018 | Motz ..................... G08C 15/02 |

(Continued)

FOREIGN PATENT DOCUMENTS

| CN | 103580693 A | 2/2014 |
| EP | 2690787 A2 | 1/2014 |
| JP | 6508665 B2 | 5/2019 |

OTHER PUBLICATIONS

Asemani, D., et al. "Subband Architecture for Hybrid Filter Bank A/D Converters," in IEEE Journal of Selected Topics in Signal Processing, vol. 2, No. 2, pp. 191-201, Apr. 2008.

(Continued)

*Primary Examiner* — Peguy Jean Pierre
(74) *Attorney, Agent, or Firm* — Christensen O'Connor Johnson Kindness PLLC (57) ABSTRACT A phase-shifted sampling module for sampling a signal is described. The phase-shifted sampling module includes a primary sampler module, an ADC module, and an equalization module. The primary sampler module includes an analog signal input, a first signal path, and a second signal path. The equalization module includes a primary sampler equalizer sub-module. The primary sampler equalizer sub-module is configured to compensate low-frequency mismatches between the first signal path and the second signal path. Further, a method for determining filter coefficients of an equalization module of a phase-shifted sampling module is described.

22 Claims, 4 Drawing Sheets

(56) References Cited

U.S. PATENT DOCUMENTS

2020/0295850 A1    9/2020   Schaefer et al.
2022/0239570 A1*   7/2022   Kaiser .................. H04L 43/028

OTHER PUBLICATIONS

De Teyou, G. K., et al. "Adaptive and Digital Blind Calibration of Transfer Function Mismatch in Time-Interleaved ADCs," 2015 IEEE 13th International New Circuits and Systems Conference (NEWCAS), Grenoble, France, 2015, pp. 1-4.

Lim, Y.C., et al. "Time-Interleaved Analog-to-Digital-Converter Compensation Using Multichannel Filters," in IEEE Transactions on Circuits and Systems I: Regular Papers, vol. 56, No. 10, pp. 2234-2247, Oct. 2009.

Satarzadeh, P., et al., "Bandwidth Mismatch Correction for a Two-Channel Time-Interleaved A/D Converter," 2007 IEEE International Symposium on Circuits and Systems, New Orleans, LA, USA, 2007, pp. 1705-1708.

Seo, M., et al. "Comprehensive digital correction of mismatch errors for a 400-msamples/s 80-dB SFDR time-interleaved analog-to-digital converter," in IEEE Transactions on Microwave Theory and Techniques, vol. 53, No. 3, pp. 1072-1082, Mar. 2005.

Xu, F. "Perfect data reconstruction algorithm of time interleaved ADCs," 2006 IEEE International Test Conference, Santa Clara, CA, USA, 2006, pp. 1-6.

* cited by examiner

PHASE-SHIFTED SAMPLING MODULE AND METHOD FOR DETERMINING FILTER COEFFICIENTS

FIELD OF THE DISCLOSURE

Embodiments of the present disclosure generally relate to a phase-shifted sampling module for sampling a signal. Embodiments of the present disclosure further relate to a measurement instrument and to a method for determining filter coefficients of an equalization module of a phase-shifted sampling module.

BACKGROUND

In order to achieve high sampling rates that exceed the sampling rate of a single analog-to-digital converter (ADC), it is known to use two or more ADCs that sample the corresponding signal in a phase-shifted manner.

The partial signals sampled by the individual ADCs are recombined into a single digitized signal, such that an integer multiple of the sampling rate of the individual ADCs is achieved.

If signals with a large bandwidth are to be digitized, such phase-shifted sampling modules usually use ADCs that each have a large bandwidth. However, large-bandwidth ADCs are rather costly.

Thus, there is a need for a phase-shifted sampling module that can be produced at reduced costs while maintaining the quality of the digitized signal.

SUMMARY

Embodiments of the present disclosure provide a phase-shifted sampling module for sampling a signal. In an embodiment, the phase-shifted sampling module comprises a primary sampler module comprising, for example, one or more circuits, an ADC module comprising, for example, one or more circuits, and an equalization module comprising, for example, one or more circuits. The primary sampler module comprises an analog signal input, a first signal path, and a second signal path. The first signal path comprises a first analog sampling unit comprising circuitry configured to sample an analog input signal received by the analog signal input, thereby generating a first pre-sampled analog input signal. The second signal path comprises a second analog sampling unit comprising circuitry configured to sample the analog input signal in a phase-shifted manner compared to the first analog sampling unit, thereby generating a second pre-sampled analog input signal.

In an embodiment, the ADC module comprises a first analog-to-digital converter associated with the first signal path. The first analog-to-digital converter is configured to sample the first pre-sampled analog input signal, thereby generating a first digital output signal.

In an embodiment, the ADC module comprises a second analog-to-digital converter associated with the second signal path. The second analog-to-digital converter is configured to sample the second pre-sampled analog input signal in a phase-shifted manner compared to the first analog-to-digital converter, thereby generating a second digital output signal.

In an embodiment, the equalization module comprises a primary sampler equalizer sub-module, wherein the primary sampler equalizer sub-module includes circuitry configured to compensate low-frequency mismatches between the first signal path and the second signal path based on the digital output signals.

Therein and in the following, the term "low-frequency mismatches" is understood to be associated with mismatches in the frequency range smaller than or equal to 200 MHz, for example smaller than or equal to 150 MHz, in particular smaller than or equal to 100 MHz.

The low-frequency mismatches may manifest as transfer functions of the first signal path and the second signal path being different from each other in the low-frequency range.

In general, the primary sampler module may have M signal paths, wherein M is an integer bigger than or equal to 2. Accordingly, the ADC module may comprise M analog-to-digital converters, wherein each of the analog-to-digital converters is associated with one of the M signal paths.

Without restriction of generality, the case M=2 is described in the following.

The first analog sampling unit and the second analog sampling unit sample the analog input signal in a phase shifted manner with respect to each other. In other words, the analog sampling units sample the same analog input signal, but at different sampling times. Thus, the phase-shifted sampling takes place.

The resulting pre-sampled analog input signals are converted by the analog-to-digital converters (ADCs), and the digital output signals of the ADCs may be recombined downstream of the ADCs, thereby obtaining a digital version of the analog input signal that is sampled at a higher sampling rate than achievable with only a single ADC.

The present disclosure inter alia relates to providing the primary sampler module that reduces the bandwidth of the analog input signal. In some embodiments, the first analog sampling unit and the second analog sampling unit reduce the bandwidth of the analog input signal. In other words, the first pre-sampled analog input signal and the second pre-sampled analog input signal each have a lower bandwidth than the analog input signal.

Thus, the ADCs each can have a lower bandwidth. Accordingly, cheaper ADCs can be used. The reduced costs of the ADCs overweigh the additional costs of the primary sampler module (which can be produced cost-efficiently), such that the overall production costs of the phase-shifted sampling module are reduced.

Due to thermal effects, different signal paths of such sampling systems do not behave identical with respect to each other in the low-frequency spectrum, i.e. in the frequency spectrum up to about 200 MHz.

As a result, low-frequency mismatches can occur between the first signal path and the second signal path, which is known as the so-called "droop-effect". This can cause unwanted disturbances in the digital output signals.

The present disclosure is further based on the idea to compensate low-frequency mismatches between the first signal path and the second signal path by filtering the digital output signals of the analog-to-digital converters by the primary equalizer sub-module.

In some embodiments, the primary sampler equalizer sub-module includes circuitry configured to compensate low-frequency mismatches between the analog signal paths within the primary sampler module.

In other words, the primary sampler equalizer sub-module is configured to remove unwanted signal perturbations caused by the low-frequency mismatches between the signal paths from the digital output signals. This way, digital outputs signals with reduced perturbations are obtained.

According to an aspect of the present disclosure, the primary sampler equalizer sub-module is established as a time variant filter. Thus, time variant perturbations in the digital output signals caused by time variant low-frequency mismatches between the first signal path and the second signal path can be compensated by the primary sampler equalizer sub-module. In other words, perturbations that vary over time can be compensated by the primary sampler equalizer sub-module.

It is noted that individual sub-filters of the primary sampler equalizer sub-module may be time invariant. However, the primary sampler equalizer sub-module as a whole is established as a time variant filter.

According to another aspect of the present disclosure, the primary sampler equalizer sub-module comprises at least two inputs and at least two outputs, wherein the primary sampler equalizer sub-module comprises filter units connecting each input with each output. In general, a first one of the two inputs is associated with the first signal path, while a second one of the two inputs is associated with the second signal path.

A first one of the two outputs may be connected to the first input by a first filter unit. Moreover, the first output may be connected to the second input by a second filter unit. Thus, signals received by the first input and the second input are filtered by the first filter unit and the second filter unit, respectively. The corresponding filtered signals are forwarded to the first output. In some embodiments, the corresponding filtered signals are superposed.

A second one of the two outputs may be connected to the first input by a third filter unit. Moreover, the second output may be connected to the second input by a fourth filter unit. Thus, signals received by the first input and the second input are filtered by the third filter unit and the fourth filter unit, respectively. The corresponding filtered signals are forwarded to the second output. In some embodiments, the corresponding filtered signals are superposed.

In an embodiment of the present disclosure, the filter units each are established as a multi-rate filter circuit. It has turned out that multi-rate filter circuits are particularly suitable for compensating low-frequency mismatches.

In a further embodiment of the present disclosure, the multi-rate filter circuit comprises at least one of a delay element, a decimator, a digital correction filter, or an interpolator. More details on the structure of the multi-rate filter circuit are given in co-pending US patent application US 2020/0295850 A1, which is hereby incorporated by reference in its entirety.

According to another aspect of the present disclosure, the equalization module comprises at least one of an ADC equalizer sub-module or an overall equalizer submodule. The ADC equalizer sub-module may be configured to compensate at least one of low-frequency mismatches within the ADC module or low-frequency mismatches in a connection path between the primary sampler module and the ADC module. The overall equalizer sub-module may be configured to compensate low-frequency mismatches originating upstream of the primary sampler module.

Therein, the "connection path between the primary sampler module and the ADC module" is understood to comprise all components downstream of the primary sampler module and upstream of the ADC module, e.g. connecting wires. These components may have a different (electrical) length and/or different temperatures, such that low-frequency mismatches may be introduced by them. The ADC equalizer sub-module may be configured to compensate these low-frequency mismatches.

The ADC equalizer sub-module may comprise a first ADC filter unit associated with the first signal path, and a second ADC filter unit associated with the second signal path. Accordingly, the first ADC filter unit may filter the first digital output signal (only), and the second ADC filter unit may filter the second digital output signal (only). Put differently, each digital output signal is filtered by a dedicated ADC filter unit.

In some embodiments, the first ADC filter unit and the second ADC filter unit may each be established as a linear time invariant filter, for example as a multi-rate filter circuit. While the individual ADC filter units may be established as time invariant filters, the ADC equalizer sub-module as a whole may be configured as a time variant filter, such that time variant perturbations can be removed by the ADC equalizer sub-module.

The overall equalizer sub-module may be established as a linear time invariant filter, for example as a multi-rate filter circuit.

In a further embodiment of the present disclosure, the ADC equalizer sub-module is provided upstream of the primary sampler equalizer sub-module.

The ADC equalizer sub-module may be provided immediately upstream of the primary sampler equalizer sub-module.

According to an aspect of the present disclosure, the overall equalizer sub-module is provided downstream of the primary sampler equalizer sub-module.

In some embodiments, the individual sub-modules of the equalization module may be arranged in inverse order with respect to the sources of low-frequency mismatches. Accordingly, the ADC equalizer sub-module may be arranged immediately downstream of the ADC module. The primary sampler equalizer sub-module may be arranged (immediately) downstream of the ADC equalizer sub-module. The overall equalizer sub-module may be arranged downstream of the primary sampler equalizer sub-module.

In some embodiments, filter coefficients of the equalizer sub-modules are obtained by a variation of a global cost functional, wherein the global cost functional depends on the filter coefficients of the individual equalizer sub-modules. In general, the variation of the global cost functional corresponds to a non-linear optimization, as there may be no linear correlation between the filter coefficients of the equalizer sub-modules and the input signal. The global cost functional may depend on a reference signal, namely an ideal reconstructed signal. The cost functional may further depend on the input signal and an equalized output signal, i.e. on a signal processed by the equalization module.

In some embodiments, the global cost functional corresponds to an error measure between an ideal output signal, i.e. the reference signal, and the equalized output signal, i.e. the signal processed by the equalization module.

In an embodiment of the present disclosure, starting coefficients for the variation of the global cost functional are obtained by local variations of local cost functionals being associated with the individual equalizer sub-modules.

In some embodiments, the local cost functionals correspond to an error measure between an ideal output signal, i.e. the reference signal, and the actual output signal of the respective equalizer sub-module.

According to another aspect of the present disclosure, the variation is performed by a least squares technique. However, it is to be understood that any other suitable optimization technique may be employed.

In a further embodiment of the present disclosure, the phase-shifted sampling module comprises an output selector module including circuitry configured to selectively output a signal associated with the first signal path or with the second signal path, for example in an alternating manner. In general, the output selector module is configured to recombine the digital output signals of the ADCs after the digital output signals have been filtered by the ADC equalizer sub-module and the primary sampler equalizer sub-module. The resulting digital output signal is sampled at a higher sampling rate than achievable by a single ADC.

The output selector module may be arranged downstream of the primary sampler equalizer sub-module. In other words, the output selector module may receive the output signals generated by the primary sampler equalizer sub-module, i.e. filtered digital output signals that have already been corrected for the low-frequency mismatches between the first signal path and the second signal path.

In some embodiments, the output selector module is arranged immediately downstream of the primary sampler equalizer sub-module. Alternatively or additionally, the output selector module is arranged upstream of the overall equalizer sub-module, for example immediately upstream of the overall equalizer sub-module.

According to another aspect of the present disclosure, the analog sampling units are established as sample & hold units composed of one or more circuits (S&H units), as track & hold units composed of one or more circuits (T&H units), or as return-to-zero sampling units composed of one or more circuits (RZ sampling units). The difference between a sample & hold unit and a return-to-zero sampling unit lies in that the sample & hold unit keeps the signal at the sampled signal level for the whole sampling period, while the return-to-zero sampling unit returns the signal level to zero within the sampling period. It has turned out that return-to-zero sampling units are particularly suitable for primary samplers operating at high sampling rates, i.e. above 10 MS/s, for example above 100 MS/s, and above 1 GS/s in some embodiments.

Embodiments of the present disclosure further provide a measurement instrument that comprises a phase-shifted sampling module described above.

In some embodiments, the measurement instrument is established as an oscilloscope. For example, the measurement instrument may be established as a digital oscilloscope.

Regarding the advantages and further properties of the measurement instrument, reference is made to the explanations given above with respect to the phase-shifted sampling module, which also hold for the measurement instrument and vice versa.

Embodiments of the present disclosure further provide a method for determining filter coefficients of an equalization module of a phase-shifted sampling module described above. The equalization module comprises at least one of an ADC equalizer sub-module configured to compensate low-frequency mismatches within the ADC module or an overall equalizer sub-module configured to compensate low-frequency mismatches originating upstream of the primary sampler module. In an embodiment, the method comprises the following steps:

receiving an input signal;

processing the input signal by the primary sampler module and the ADC module, thereby obtaining at least a first digital output signal and a second digital output signal;

processing the first digital output signal and the second digital output signal by the equalization module, thereby obtaining an equalized output signal;

providing a global cost functional that depends on filter coefficients of the individual equalizer sub-modules, the input signal, and the equalized output signal; and determining the filter coefficients of the equalizer sub-modules by a global variation of the global cost functional.

In general, the variation of the global cost functional corresponds to a non-linear optimization, as there may be no linear correlation between the filter coefficients of the equalizer sub-modules and the input signal. The global cost functional may depend on a reference signal, namely an ideal reconstructed signal. The cost functional may further depend on the input signal and an equalized output signal, i.e. on a signal processed by the equalization module.

In some embodiments, the global cost functional corresponds to an error measure between an ideal output signal, i.e. the reference signal, and the equalized output signal, i.e. the signal processed by the equalization module.

Regarding the further advantages and properties of the method, reference is made to the explanations given above with respect to the phase-shifted sampling module, which also hold for the method and vice versa.

According to an aspect of the present disclosure, starting coefficients for the variation of the global cost functional are obtained by local variations of local cost functionals associated with the individual equalizer sub-modules. In other words, a first optimization is performed for the equalizer sub-modules individually. The results of this first optimization, i.e. preliminary filter coefficients for the equalizer sub-modules, may then be used for a second optimization, namely the variation of the global cost functional.

The individual local cost functionals may depend on filter coefficients of the respective equalizer sub-module, on a reference signal (i.e. an ideal output signal of the respective equalizer sub-module), and on an actual output signal of the respective equalizer sub-module.

In some embodiments, the local cost functionals correspond to an error measure between an ideal output signal, i.e. the reference signal, and the actual output signal of the respective equalizer sub-module.

The variation may be performed by a least squares technique. However, it is to be understood that any other suitable optimization technique may be employed.

According to another aspect of the present disclosure, the global cost functional corresponds to an error measure between an ideal output signal of the equalizer sub-modules and an actual output signal of the equalizer sub-modules.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
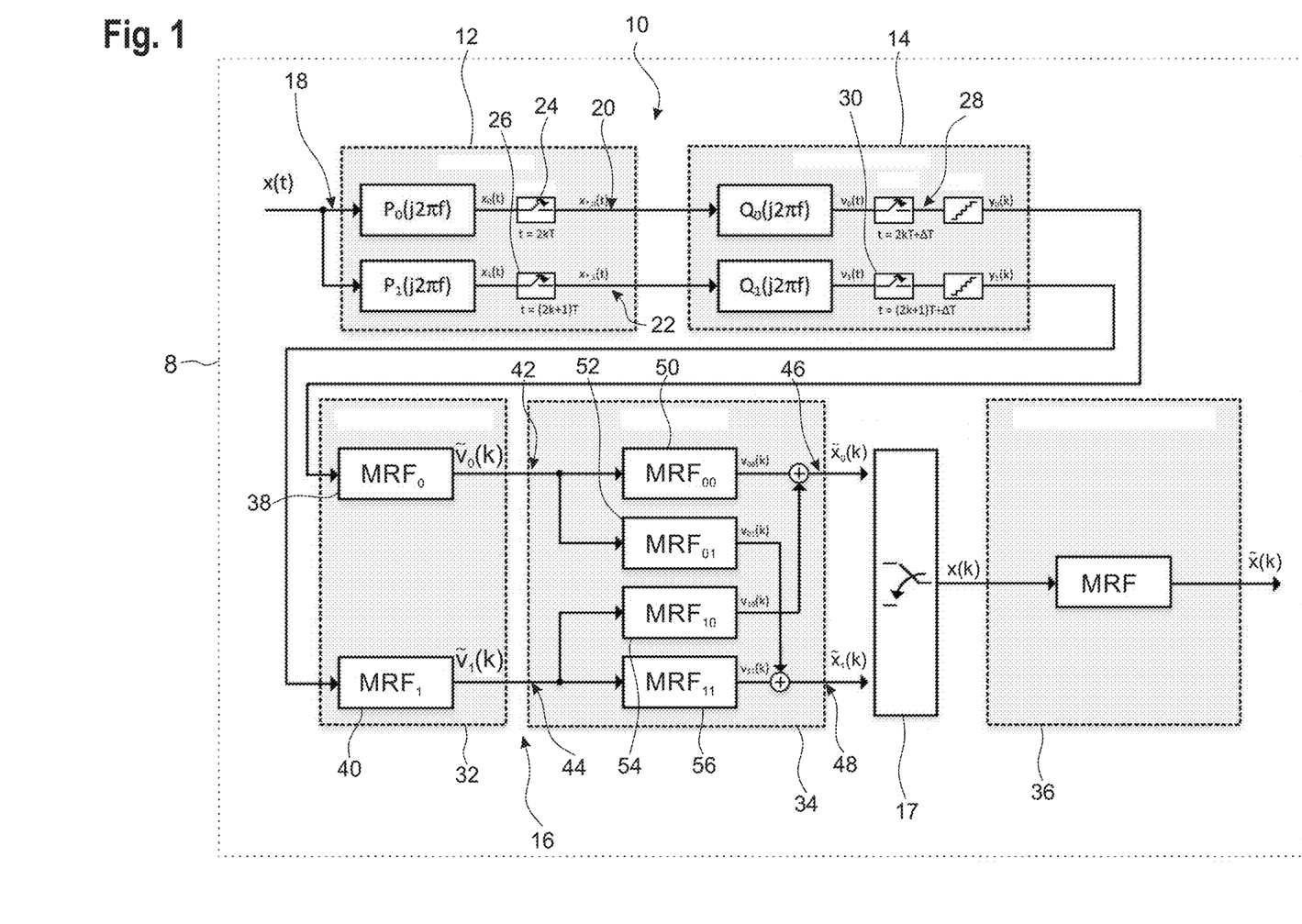
FIG. 1 schematically shows a phase-shifted sampling module according to an embodiment of the present disclosure.

FIG. 1 schematically shows a measurement instrument 8 comprising a phase-shifted sampling module 10. In some embodiments, the measurement instrument 8 may be established as an oscilloscope. For example, the measurement instrument 8 may be established as a digital oscilloscope. However, it is to be understood that the phase-shifted sampling module 10 described below may also be used in another type of electronic device.

The phase-shifted sampling module 10 comprises a primary sampler module 12, an ADC module 14, an equalization module 16, and an output selector module 17.

In some embodiments, the term "module" or "unit" refers to a combination of hardware (e.g. a processor such as an integrated circuit or other circuitry) and software (e.g. machine- or processor-executable instructions, commands, or code such as firmware, programming, or object code). Furthermore, a combination of hardware and software may include hardware only (i.e. a hardware element with no software elements), software hosted at hardware (e.g. software that is stored at a memory and executed or interpreted at a processor), or hardware with the software hosted thereon. In some embodiments, the hardware may, inter alia, comprise a CPU, a GPU, an FPGA, an ASIC, or other types of electronic circuitry.

In the shown embodiment, the primary sampler module 12 comprises an analog signal input 18, a first signal path 20, and a second signal path 22. In general, the primary sampler module 12 may have M signal paths, wherein M is an integer bigger than or equal to 2.

The first signal path 20 comprises a first analog sampling unit 24 including circuitry configured to sample an analog input signal received by the analog signal input 18. The second signal path 22 comprises a second analog sampling unit 26 including circuitry configured to sample the analog input signal in a phase-shifted manner compared to the first analog sampling unit 24. The analog sampling units 24, 26 are each established as a sample & hold circuit, as a track & hold circuit, or as a return-to-zero sampling circuit.

In the shown embodiment, the ADC module 14 comprises a first analog-to-digital converter 28 associated with the first signal path 20 and a second analog-to-digital converter 30 associated with the second signal path 22 of the primary sampler module 12. In general, the ADC module 14 may comprise M analog-to-digital converters, wherein each of the analog-to-digital converters is associated with one of the M signal paths of the primary sampler module 12. Hence, each signal path may be associated with a dedicated analog-to-digital converter. Without restriction of generality, the case M=2 is described in the following.

The equalization module 16 comprises an ADC equalizer sub-module 32, a primary sampler equalizer sub-module 34, and an overall equalizer sub-module 36. Each of these sub-modules, or other sub-modules disclosed herein, may include one or more circuits.

The ADC equalizer sub-module 32 is arranged immediately downstream of the ADC module 14. The ADC equalizer sub-module 32 comprises a first ADC filter unit 38 being associated with the first signal path 20, and a second ADC filter unit 40 being associated with the second signal path 22. The first ADC filter unit 38 and the second ADC filter unit 40 may each be established as a time invariant filter, for example as a multi-rate filter circuit. While the individual ADC filter units 38, 40 may be established as time invariant filters, the ADC equalizer sub-module 32 as a whole may be configured as a time variant filter, such that time variant perturbations can be removed by the ADC equalizer sub-module 32.

The primary sampler equalizer sub-module 34 is arranged immediately downstream of the ADC equalizer sub-module 32. The primary sampler equalizer sub-module 34 comprises a first input 42, a second input 44, a first output 46, and a second output 48.

The first input 42 is connected with the first output 46 via a first filter unit 50. Moreover, the first input 42 is connected with the second output 48 via a second filter unit 52. The second input 44 is connected with the first output 46 via a third filter unit 54. Moreover, the second input 44 is connected with the second output 48 via a fourth filter unit 56.

In general, the primary sampler equalizer sub-module 34 may be established as a time variant filter. The individual filter units 50, 52, 54, 56 may be established as multi-rate filter circuits.

The output selector module 17 is arranged immediately downstream of the primary sampler equalizer sub-module 34. The overall equalizer sub-module 36 is arranged immediately downstream of the output selector module 17. The overall equalizer sub-module 36 may be established as a time invariant filter, for example as a multi-rate filter circuit.

Figure 2:
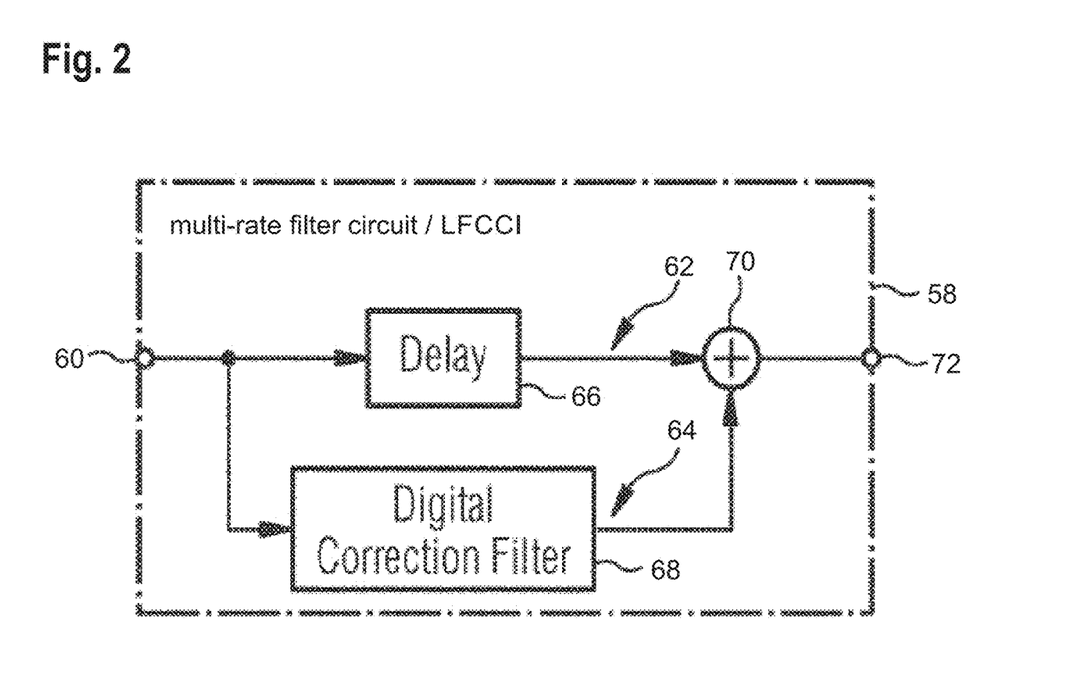
FIG. 2 schematically shows a multi-rate filter circuit of the phase-shifted sampling module of FIG. 1.

FIG. 2 schematically shows a multi-rate filter circuit 58 that may be used in the ADC equalizer sub-module 32, in the primary sampler equalizer sub-module 34 and/or in the overall equalizer sub-module 36. As can be seen in the block diagram of FIG. 2, the multi-rate filter circuit 58 is established as a low frequency, LF, correction circuit (LFCCI) that can be used for the correction of low frequency disturbances within a digital signal applied to a signal input terminal 60 of the multi-rate filter circuit 58.

In the embodiment shown, the multi-rate filter circuit 58 comprises a main signal path 62 and at least one correction signal path 64. The main signal path 62 and the correction signal path 64 are implemented in parallel within the multi-rate filter circuit 58. The main signal path 62 of the multi-rate filter circuit 58 is provided to delay the received digital input signal with a predetermined delay time. In a possible embodiment, the main signal path 62 comprises a delay unit 66 adapted to delay the received digital input signal with a predetermined delay time. The correction signal path 64 comprises at least one digital correction filter 68 adapted to filter the received digital input signal. In an embodiment, the main signal path 62 may comprise a long signal line having a length adapted to the required delay time.

The multi-rate filter circuit 58 further comprises an adder 70 adapted to add the digital signal delayed by the main signal path 62 and the digital signal corrected by the correction signal path 64 to generate a digital output signal output by a signal output terminal 72 of the multi-rate filter circuit 58.

More details on the structure of examples of the multi-rate filter circuit 58 are given in co-pending US patent application US 2020 0 295 850 A1, which is hereby incorporated by reference in its entirety.

Embodiments of the phase-shifted sampling module 10 are configured to perform a phase-shifted sampling method that is described in the following with reference to FIG. 3. In some embodiments, the phase-shifted sampling module 10 includes program code, instructions, scripts, etc. ("a program element"), which is configured and arranged when executed on a computer or suitable circuitry (e.g., microprocessor, DSP, ASIC, SoC, etc.,) to perform one or more steps of the method set forth in FIG. 3 or in the subsequent claims.

Figure 3:
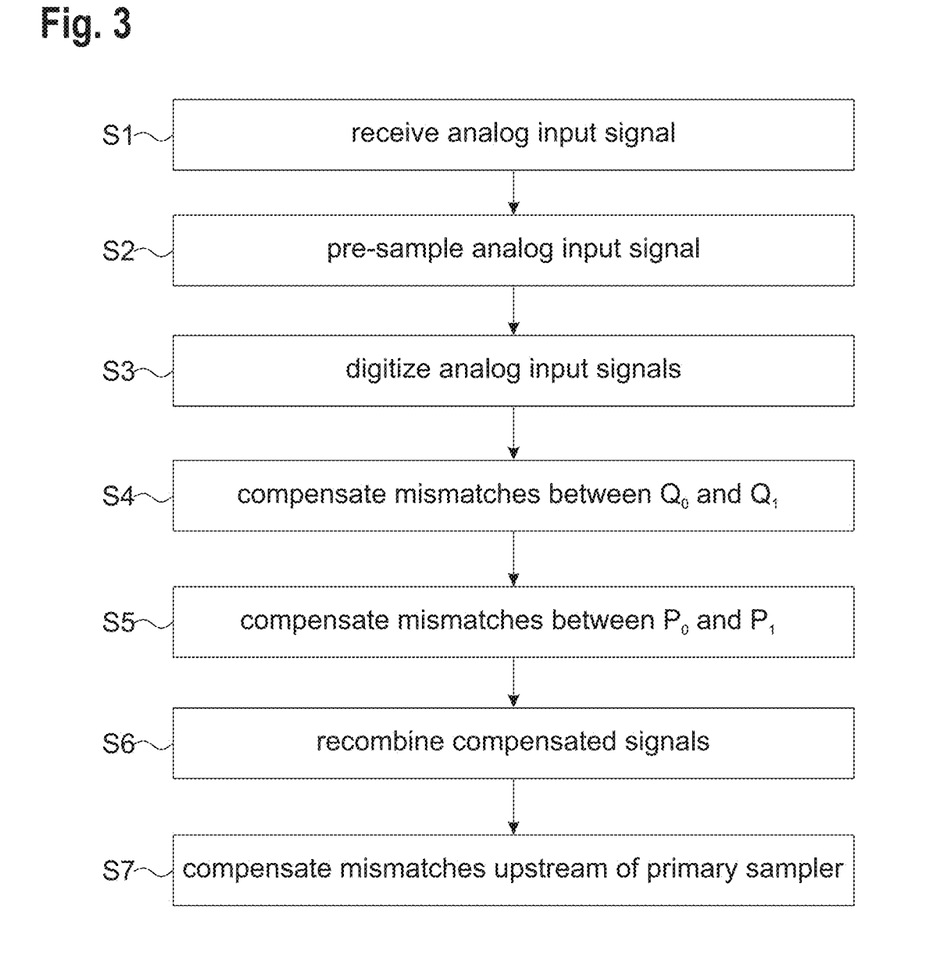
FIG. 3 shows a flow chart of an embodiment of a phase-shifted sampling method according to the present disclosure.

As shown in FIG. 3, an analog input signal x(t) is received by the analog signal input 18 (step S1). The analog input signal is forwarded to the first sampling unit 24 and to the second sampling unit 26 via the first signal path 20 and the second signal path 22, respectively.

Due to thermal effects, the two signal paths 20, 22 may not be completely identical, and thus may have transfer functions that are not completely identical in a low-frequency range, i.e. at frequencies below 200 MHz, for example below 150 MHz, in particular below 100 MHz. This thermal effect is also known as "droop-effect".

Thus, the first sampling unit 24 receives an analog input signal $x_0(t)$ due to the transfer function $P_0(j2\pi f)$ of the first signal path 20. The second sampling unit 26 receives an analog input signal $x_1(t)$ due to the transfer function $P_1(j2\pi f)$ of the second signal path 22, wherein in general $x_1(t) \neq x_0(t)$ due to $P_1(j2\pi f) \neq P_0(j2\pi f)$.

Accordingly, there may be a low-frequency mismatch between the first signal path 20 and the second signal path 22 within the primary sampler module 12.

The analog input signals $x_0(t)$, $x_1(t)$ are sampled by the sampling units 24, 26, thereby generating a first pre-sampled analog input signal $x_{*,0}(t)$ and a second pre-sampled analog input signal $x_{*,1}(t)$, respectively (step S2).

The sampling units 24, 26 each operate with a sampling frequency $f_S = 1/(2T)$. However, the first sampling unit 24 samples the analog input signal x(t) in a phase-shifted manner compared to the second sampling unit 26.

In some embodiments, the first sampling unit 24 samples the analog input signal $x_0(t)$ at sample times $t=2kT$, while the second sampling unit 26 samples the analog input signal $x_1(t)$ at sample times $t=(2k+1)T$, wherein, k is an integer.

In other words, the two sampling units 24 sample the input signal x(t) alternately.

The first pre-sampled analog input signal $x_{*,0}(t)$ and the second pre-sampled analog input signal $x_{*,1}(t)$ are forwarded to the first ADC 28 and to the second ADC 30, respectively.

In general, a connection path between the first sampling unit 24 and the first ADC 28 may be different from the connection path between the second sampling unit 26 and the second ADC 30. In some embodiments, the droop-effect explained above may also occur between the connection paths. Accordingly, the two connection paths may have different transfer functions.

Therein, the term "connection path" is understood to comprise all components downstream of the primary sampler module 12 and upstream of the ADC module 14, e.g. connecting wires.

Moreover, signal paths within the ADC module 14 may also have transfer functions that are different from each other due to the droop-effect explained above. Thus, additional low-frequency mismatches may occur.

In FIG. 1, the overall effect of the connection paths and the signal paths within the ADC module 14 is summarized in the transfer functions $Q_0(j2\pi f)$ and $Q_1(j2\pi f)$. As a result of the transfer function $Q_0(j2\pi f)$, the first ADC 28 receives a modified version $v_0(t)$ of the first pre-sampled input signal $x_{*,0}(t)$. Similarly, the second ADC 30 receives a modified version $v_1(t)$ of the second pre-sampled input signal $x_{*,1}(t)$ due to the transfer function $Q_1(j2\pi f)$.

The ADCs 28, 30 digitize the pre-sampled analog input signals $v_0(t)$, $v_1(t)$, thereby obtaining a first digital output signal $y_0(k)$ and a second digital output signal $y_1(k)$, respectively (step S3). The ADCs 28, 30 each operate with a sampling frequency $f_S = 1/(2T)$, for example wherein the sampling frequency of the ADCs 28, 30 matches the sampling frequency of the sampling units 24, 26.

However, the first ADC 28 samples the first pre-sampled analog input signal $v_0(t)$ in a phase-shifted manner compared to the second ADC 30 sampling the second pre-sampled analog input signal $v_1(t)$. In some embodiments, first ADC 28 samples the first pre-sampled analog input signal $v_0(t)$ at sample times $t=2kT+\Delta T$, while the second ADC 30 samples the second pre-sampled analog input signal $v_1(t)$ at sample times $t=(2k+1)T+\Delta T$, wherein, k is an integer and $\Delta T$ is a time shift accounting for the propagation time of the signals from the sampling units 24, 26 to the ADCs 28, 30.

The digital output signals $y_0(k)$, $y_1(k)$ are forwarded to the equalization module 16, for example to the ADC equalizer sub-module 32.

Low-frequency mismatches, i.e. mismatches between the transfer functions $Q_0(j2\pi f)$, $Q_1(j2\pi f)$ in the low-frequency range are compensated by the ADC equalizer sub-module 32 (step S4). Thus, the ADC equalizer sub-module 32 compensates low-frequency mismatches originating within the ADC module 14 and in a connection path between the primary sampler module 12 and the ADC module 14.

For example, the first ADC filter unit 38 filters the first digital output signal $y_0(k)$, thereby generating a first filtered digital output signal $\tilde{v}_0(k)$. The second ADC filter unit 40 filters the second ADC filter unit 40 filters the second digital output signal $y_1(k)$, thereby generating a second filtered digital output signal $\tilde{v}_1(k)$.

Therein, transfer functions $MRF_0(z)$ and $MRF_1(z)$ of the ADC filter units 38, 40 are chosen such that the low-frequency mismatches between the transfer functions $Q_0(j2\pi f)$, $Q_1(j2\pi f)$ are compensated. In other words, filter coefficients of the ADC equalizer sub-module 32 are chosen such that the low-frequency mismatches between the transfer functions $Q_0(j2\pi f)$, $Q_1(j2\pi f)$ are compensated.

Accordingly, in the case of perfect reconstruction, it holds $\tilde{v}_0(k) = v_0(t)$ for $t=2kT+\Delta T$ and $\tilde{v}_1(k) = v_1(t)$ for $t=(2k+1)T+\Delta T$. This will be explained in more detail below.

The filtered digital output signals $\tilde{v}_0(k)$, $\tilde{v}_1(k)$ are forwarded to the first input 42 and to the second input 44 of the primary sampler equalizer sub-module 34, respectively.

Low-frequency mismatches between the transfer functions $P_0(j2\pi f)$, $P_1(j2\pi f)$ are compensated by the primary sampler equalizer sub-module 34 (step S5). Thus, the primary sampler equalizer sub-module 34 compensates low-frequency mismatches originating within the primary sampler module 12.

Therein, transfer functions $MRF_{00}(z)$, $MRF_{01}(z)$, $MRF_{10}(z)$, and $MRF_{11}(z)$ of the filter units 50, 52, 55, 56 are chosen such that the low-frequency mismatches between the transfer functions $P_0(j2\pi f)$, $P_1(j2\pi f)$ are compensated. In other words, filter coefficients of the primary sampler equalizer sub-module 34 are chosen such that the low-frequency mismatches between the transfer functions $P_0(j2\pi f)$, $P_1(j2\pi f)$ are compensated.

For example, the first filter unit 50 filters the first filtered digital output signal $\tilde{v}_0(k)$, thereby generating a first intermediate signal $v_{00}(k)$. The second filter unit 52 filters the first filtered digital output signal $\tilde{v}_0(k)$, thereby generating a second intermediate signal $v_{01}(k)$. The third filter unit 54 filters the second filtered digital output signal $\tilde{v}_1(k)$, thereby generating a third intermediate signal $v_{10}(k)$. The fourth filter unit 56 filters the second filtered digital output signal $\tilde{v}_1(k)$, thereby generating a fourth intermediate signal $v_{11}(k)$.

The first intermediate signal $v_{00}(k)$ and the third intermediate signal $v_{10}(k)$ are superposed, thereby generating a first compensated digital output signal $\tilde{x}_0(k)$ being associated with the first output 46. The second intermediate signal $v_{01}(k)$ and the fourth intermediate signal $v_{11}(k)$ are superposed, thereby generating a second compensated digital output signal $\tilde{x}_1(k)$ being associated with the second output 48.

Accordingly, in the case of perfect reconstruction, it holds $\tilde{x}_0(k)=x_0(t)$ for $t=2k\,T$ and $\tilde{x}_1(k)=x_1(t)$ for $t=(2k+1)T$. This will be explained in more detail below.

The compensated digital output signals $\tilde{x}_0(k)$, $\tilde{x}_1(k)$ are forwarded to the output selector module 17. The compensated digital output signals $\tilde{x}_0(k)$, $\tilde{x}_1(k)$ are recombined by the output selector module 17 (step S6). For example, the output selector module 17 selectively outputs a signal associated with the first signal path 20, i.e. the first compensated digital output signal $\tilde{x}_0(k)$, and a signal associated with the second signal path 22, i.e. the second compensated digital output signal $\tilde{x}_1(k)$, in an alternating manner. The resulting digital output signal $x(k)$ is sampled at a higher sampling rate than achievable by a single ADC.

The digital output signal $x(k)$ is forwarded to the overall equalizer sub-module 36. The digital output signal $x(k)$ is filtered by the overall equalizer sub-module 36, thereby compensating low-frequency mismatches originating upstream of the primary sampler module 12 (step S7).

As a result, a compensated digital output signal $\tilde{x}(k)$ with reduced perturbations due to low-frequency mismatches is obtained.

In some embodiments, time variant perturbations due to time variant low-frequency mismatches can be reduced or even removed, such that the compensated digital output signal $\tilde{x}(k)$ bears reduced or no time variant perturbations due to low-frequency mismatches.

Figure 4:
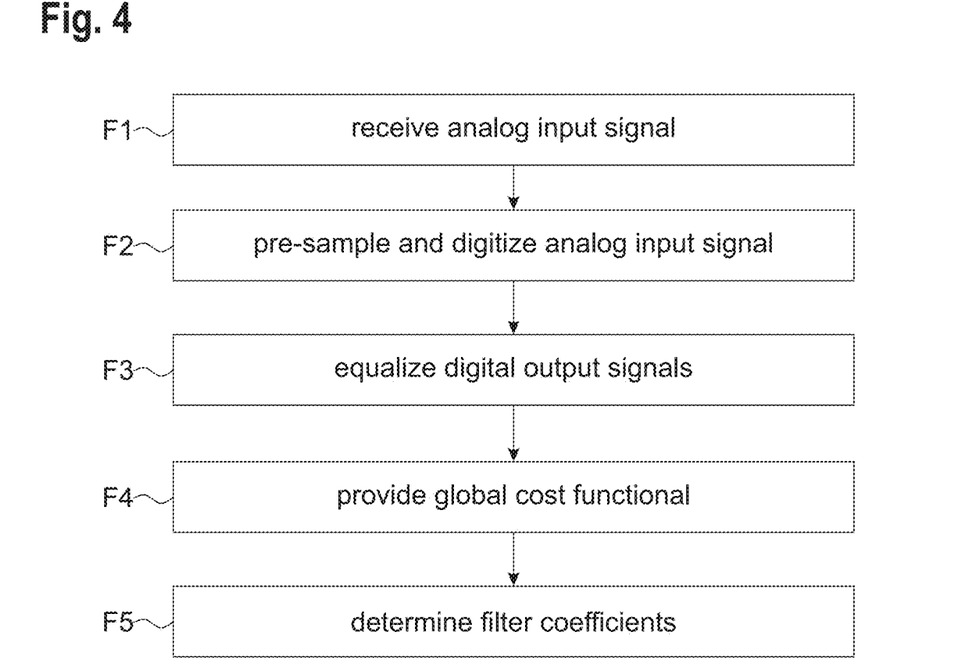
FIG. 4 shows a flow chart of a method for determining filter coefficients according to an embodiment of the present disclosure.

In the following, a method for determining filter coefficients of the equalization module 16 of the phase-shifted sampling module 10 is described with respect to FIG. 4. In some embodiments, one or more components described herein includes a program element (e.g., program code, instructions, scripts, etc., which is configured and arranged when executed on a computer or suitable circuitry (e.g., microprocessor, DSP, ASIC, SoC, etc.,) to perform one or more steps of the method set forth in FIG. 4 or in the subsequent claims.

The input signal $x(t)$ is received by the analog signal input 18 (step F1).

The input signal $x(t)$ is processed by the primary sampler module 12 and the ADC module 14 (cf. steps S2 and S3 described above), thereby obtaining at least a first digital output signal $y_0(k)$ and a second digital output signal $y_1(k)$ (step F2).

The first digital output signal $y_0(k)$ and the second digital output signal $y_1(k)$ are processed by the equalization module 16 (cf. steps S4 to S7 described above), thereby obtaining an equalized output signal $\tilde{x}(k)$ (step F3).

A global cost functional is provided, wherein the global cost functional depends on filter coefficients of the individual equalizer sub-modules 32, 34, 36, the input signal $y(n)=(y_0(n),y_1(n))$ of the equalization module 16, and the equalized output signal $\tilde{x}(k)$ (step F4).

In general, the global cost functional has the following form:

$$Q = \sum_{n=0}^{N-1} (\tilde{x}(n) - \tilde{x}_{ideal}(n))^2.$$

Therein, the dependence of the global cost functional on the filter coefficients is implicit, as the equalized output signal is a function $\tilde{x}(n)=f_{ges}(b_{ges},y,n)$ of a filter coefficient vector $b_{ges}$ and of the input signal vector $y$. Moreover, N is the signal length (i.e. the number of samples) over which the cost functional is evaluated.

$\tilde{x}_{ideal}$ is an ideal reference signal, i.e. an ideal reconstructed signal.

Filter coefficients of the equalizer sub-modules 32, 34, 36 are determined by a global variation of the global cost functional (step F5).

In some embodiments, the global cost functional is minimized in order to find the filter coefficients of the individual equalizer sub-modules 32, 34, 36, i.e.

$$\min_b \left\{ \sum_{n=0}^{N-1} (f_{ges}(b_{ges}, y, n) - \tilde{x}_{ideal}(n))^2 \right\}.$$

Alternatively, the maximal error may be minimized, i.e.

$$\min_b \left\{ \max_n \{ f_{ges}(b_{ges}, y, n) - \tilde{x}_{ideal}(n) \} \right\}.$$

Therein, the starting coefficients for the variation of the global cost functional Q are obtained by local variations of local cost functionals being associated with the individual equalizer sub-modules 32, 34, 36.

Accordingly, three different local cost functionals $Q_{ADCE}$, $Q_{PSE}$, and $Q_{OSE}$ are provided for the ADC equalizer sub-module 32, the primary sampler equalizer sub-module 34, and the overall equalizer sub-module 36, respectively.

The local cost functionals have the following general form:

$$Q_X = \sum_{n=0}^{N-1} (x_X(n) - x_{X,ref}(n))^2,$$

wherein X can be ACDE, PSE, or OSE. Moreover, $x_X(n)$ is the actual output signal of the respective equalizer sub-module 32, 34, 36, and $x_{X,ref}(n)$ is the corresponding ideal output signal of the respective equalizer sub-module 32, 34, 36, i.e. the corresponding reference signal.

In order to obtain the starting coefficients for the global optimization, the local cost functionals $Q_X$ are minimized, i.e.

$$\min_b \left\{ \sum_{n=0}^{N-1} (x_X(n) - x_{X,ref}(n))^2 \right\}.$$

Alternatively, the maximal error may be minimized, i.e.

$$\min_b \left\{ \max_n \{ x_X(n) - x_{X,ref}(n) \} \right\}.$$

In other words, a first optimization is performed for the equalizer sub-modules 32, 34, 36 individually.

The results of this first optimization, i.e. preliminary filter coefficients for the equalizer sub-modules 32, 34, 36, may then be used as starting conditions for a second optimization, namely the variation of the global cost functional Q.

It is noted that for the variations or rather optimizations described above, any suitable mathematical technique may be used, e.g. Gauß-Newton or Nelder-Meat.

Certain embodiments disclosed herein, for example the respective module(s), unit(s), etc., utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

In some examples, the functionality described herein can be implemented by special purpose hardware-based computer systems or circuits, etc., or combinations of special purpose hardware and computer instructions.

Of course, in some embodiments, two or more of the components described herein, or parts thereof, can be integrated or share hardware and/or software, circuitry, etc. In some embodiments, these components, or parts thereof, may be grouped in a single location or distributed over a wide area. In circumstances were the components are distributed, the components are accessible to each other via communication links.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A phase-shifted sampling module for sampling a signal, the phase-shifted sampling module comprising:
   a primary sampler circuit, an ADC circuit, and an equalization circuit,
   the primary sampler circuit comprising an analog signal input, a first signal path, and a second signal path,
   wherein the first signal path comprises a first analog sampling unit configured to sample an analog input signal received by the analog signal input, thereby generating a first pre-sampled analog input signal,
   wherein the second signal path comprises a second analog sampling unit configured to sample the analog input signal in a phase-shifted manner compared to the first analog sampling unit, thereby generating a second pre-sampled analog input signal,
   wherein the ADC circuit comprises a first analog-to-digital converter associated with the first signal path, wherein the first analog-to-digital converter is configured to sample the first pre-sampled analog input signal, thereby generating a first digital output signal,
   wherein the ADC circuit comprises a second analog-to-digital converter associated with the second signal path, wherein the second analog-to-digital converter is configured to sample the second pre-sampled analog input signal in a phase-shifted manner compared to the first analog-to-digital converter, thereby generating a second digital output signal, and
   wherein the equalization circuit comprises a primary sampler equalizer sub-circuit, wherein the primary sampler equalizer sub-circuit is configured to compensate low-frequency mismatches between the first signal path and the second signal path based on the digital output signals.

2. The phase-shifted sampling module according to claim 1, wherein the primary sampler equalizer sub-circuit is established as a time variant filter.

3. The phase-shifted sampling module according to claim 2, wherein the primary sampler equalizer sub-circuit comprises at least two inputs and at least two outputs, wherein the primary sampler equalizer sub-circuit comprises filter units connecting each input with each output.

4. The phase-shifted sampling module according to claim 3, wherein the filter units each are established as a multi-rate filter circuit.

5. The phase-shifted sampling module according to claim 4, wherein the multi-rate filter circuit comprises at least one of a delay element, a decimator, a digital correction filter, and an interpolator.

6. The phase-shifted sampling module according to claim 1, wherein the equalization circuit comprises at least one of an ADC equalizer sub-circuit and an overall equalizer sub-circuit,
- wherein the ADC equalizer sub-circuit is configured to compensate at least one of low-frequency mismatches within the ADC circuit and low-frequency mismatches in a connection path between the primary sampler circuit and the ADC circuit, and
- wherein the overall equalizer sub-circuit is configured to compensate low-frequency mismatches originating upstream of the primary sampler circuit.

7. The phase-shifted sampling module according to claim 6, wherein the ADC equalizer sub-circuit is provided upstream of the primary sampler equalizer sub-circuit.

8. The phase-shifted sampling module according to claim 7, wherein the ADC equalizer sub-circuit is provided immediately upstream of the primary sampler equalizer sub-circuit.

9. The phase-shifted sampling module according to claim 6, wherein the overall equalizer sub-circuit is provided downstream of the primary sampler equalizer sub-circuit.

10. The phase-shifted sampling module according to claim 6, wherein filter coefficients of the equalizer sub-circuits are obtained by a variation of a global cost functional, wherein the global cost functional depends on the filter coefficients of the individual equalizer sub-circuits.

11. The phase-shifted sampling module according to claim 10, wherein starting coefficients for the variation of the global cost functional are obtained by local variations of local cost functionals being associated with the individual equalizer sub-circuits.

12. The phase-shifted sampling module according to claim 10, wherein the variation is performed by a least squares technique.

13. The phase-shifted sampling module according to claim 1, wherein the phase-shifted sampling circuit comprises an output selector circuit configured to selectively output a signal associated with the first signal path or with the second signal path.

14. The phase-shifted sampling module according to claim 13, wherein the output selector circuit is arranged downstream of the primary sampler equalizer sub-circuit.

15. The phase-shifted sampling module according to claim 14, wherein the output selector circuit is arranged immediately downstream of the primary sampler equalizer sub-circuit.

16. The phase-shifted sampling module according to claim 1, wherein the analog sampling units are established as sample & hold units, as track & hold units, or as return-to-zero sampling units.

17. A measurement instrument, the measurement instrument comprising a phase-shifted sampling module according to claim 1.

18. The measurement instrument of claim 17, wherein the measurement instrument is established as an oscilloscope.

19. A method for determining filter coefficients of an equalization circuit of a phase-shifted sampling module according to claim 1, wherein the equalization circuit comprises at least one of an ADC equalizer sub-circuit configured to compensate low-frequency mismatches within the ADC circuit, and an overall equalizer sub-circuit configured to compensate low-frequency mismatches originating upstream of the primary sampler circuit, the method comprising:
- receiving an input signal;
- processing the input signal by the primary sampler circuit and the ADC circuit, thereby obtaining at least a first digital output signal and a second digital output signal;
- processing the first digital output signal and the second digital output signal by the equalization circuit, thereby obtaining an equalized output signal;
- providing a global cost functional that depends on filter coefficients of the individual equalizer sub-circuits, the input signal, and the equalized output signal; and
- determining the filter coefficients of the equalizer sub-circuits by a global variation of the global cost functional.

20. The method according to claim 19, wherein starting coefficients for the variation of the global cost functional are obtained by local variations of local cost functionals associated with the individual equalizer sub-circuits.

21. The method according to claim 19, wherein the variation is performed by a least squares technique.

22. The method according to claim 19, wherein the global cost functional corresponds to an error measure between an ideal output signal of the equalizer sub-circuits and an actual output signal of the equalizer sub-circuits.

* * * * *